United States Patent
Tamamushi (10) Patent No.: US 7,800,084 B2
(45) Date of Patent: Sep. 21, 2010

(54) SYSTEM AND METHOD FOR CHARGED-PARTICLE BEAM LITHOGRAPHY

(75) Inventor: Shuichi Tamamushi, Fujisawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 434 days.

(21) Appl. No.: 11/933,797

(22) Filed: Nov. 1, 2007

(65) Prior Publication Data

US 2008/0105827 A1  May 8, 2008

(30) Foreign Application Priority Data

Nov. 2, 2006 (JP) .............. 2006-298357

(51) Int. Cl.
*G21K 5/00* (2006.01)
(52) U.S. Cl. .............. 250/492.22; 250/396 R; 250/400; 250/492.1; 250/492.2; 250/492.3; 430/22; 430/30; 430/296; 430/942
(58) Field of Classification Search ............. 250/396 R, 250/400, 492.1, 492.2, 492.22, 492.23, 492.3; 430/22, 30, 296, 942
See application file for complete search history.

(56) References Cited

U.S. PATENT DOCUMENTS 5,885,747 A * 3/1999 Yamasaki et al. ........... 430/296
5,894,057 A * 4/1999 Yamaguchi et al. ........... 430/30
6,313,476 B1 * 11/2001 Shimizu et al. ......... 250/492.22
6,319,642 B1 * 11/2001 Hara et al. .................... 430/30
7,129,024 B2 * 10/2006 Ki .............................. 430/296
2005/0072941 A1 * 4/2005 Tanimoto et al. ....... 250/492.22
2005/0184258 A1 * 8/2005 Kim et al. .............. 250/492.22
2007/0023703 A1 * 2/2007 Sunaoshi et al. ....... 250/492.22
2008/0067338 A1 * 3/2008 Nishimura et al. ....... 250/252.1

FOREIGN PATENT DOCUMENTS

JP          10-32188        2/1998
KR      2004-0014061       2/2004

* cited by examiner

*Primary Examiner*—Jack I Berman
*Assistant Examiner*—Michael Maskell
(74) *Attorney, Agent, or Firm*—Oblon, Spivak, McClelland, Maier & Neustadt, L.L.P.

(57) ABSTRACT

A charged-particle beam lithography system is provided. A region to be patterned is divided into plural frames, a main deflection positions a beam to a subfield within the frame, and an auxiliary deflection draws a pattern in units of subfield. The deflection control portion draws a pattern in units of stripe including a first frame drawing region and a second frame drawing region. The first frame drawing region corresponds to one of the frames, and the second frame drawing region is a region moved by a distance C from the first frame drawing region toward a frame to be drawn next. The deflection control portion controls the driver to alternately pattern a first sub-field drawing region in the first frame drawing region and a second sub-field drawing region in the second frame drawing region. The distance C satisfies 0<C<Ws. Ws is a width of the subfield.

11 Claims, 8 Drawing Sheets

SYSTEM AND METHOD FOR CHARGED-PARTICLE BEAM LITHOGRAPHY

CROSS REFERENCE TO RELATED APPLICATIONS

This application is based on and claims the benefit of priority from prior Japanese Patent Application No. 2006-298357, filed on Nov. 2, 2006, the entire contents of which are incorporated herein by reference.

BACKGROUND OF THE INVENTION

1. Field of the Invention

The present invention relates to a system and a method for charged-particle beam lithography, and more particularly to a system and a method for charged-particle beam lithography that deflect the charged-particle beam using multi-stage deflectors.

2. Description of the Related Art

A charged-particle beam lithography system is used to form a semiconductor integrated circuit pattern on a resist applied on a semiconductor substrate such as a mask or a wafer. The charged-particle beam lithography system irradiates a charged-particle beam such as an electron beam to a predetermined region on the semiconductor substrate by scanning the beam using an electromagnetic means. A wide range of deflection causes errors due to an aberration or the like. The errors distort the pattern shape drawn on the substrate. The maximum possible deflection is therefore often limited to a few millimeters at most so that a pattern position accuracy or a pattern connection accuracy at deflection boundaries has errors within an accepted range.

This type of system generally uses a scheme for deflecting the electron beam using multi-stage deflectors to provide a highly accurate and high-throughput patterning. The multi-stage deflectors may include two-stage deflectors of one main deflector and one auxiliary deflector or three-stage deflectors of one main deflector and two auxiliary deflectors. The region to be patterned in the semiconductor integrated circuit is usually larger than the maximum possible deflection of the electron beam lithography system. The entire semiconductor integrated circuit pattern (chip) is divided into a plurality of regions, each being a region to which the electron beam can be deflected. The regions are then sequentially and continuously patterned, thereby forming the entire pattern.

The semiconductor integrated circuits are increasingly reduced in size. More highly accurate patterning is thus requested. A proposed method to provide the highly accurate patterning is a multiple patterning. In this method, the patterns to be drawn are repeatedly drawn in an overlapping manner. This thus reduces or averages the errors of the pattern position accuracy and the pattern connection accuracy at the deflection boundaries, thereby greatly increasing the accuracies.

JPH5-234863 discloses a patterning method in which one set of figure data produces n sets of different data, the data corresponding to different subregion positions. These sets of data are drawn in an overlapping manner to prevent errors in the pattern connection areas at the deflection boundaries. Unfortunately, this method should prepare in advance n sets of drawing data to be overlapped, the data having shifted deflection boundaries. This inevitably increases data conversion time and drawing data amount. Specifically, data of the semiconductor circuit patterns created by a CAD or the like should be converted to data (drawing data) for the lithography system. The conversion requires a large amount of time for calculation. The n sets of data to be overlapped increase the amount of time for calculation required for the data conversion by a multiple of n, thus also increasing the drawing data by a multiple of n.

A hierarchy process data conversion scheme is proposed to reduce the data conversion time and compress the drawing data. Unfortunately, when shifted deflection boundaries are used, the hierarchy conversion scheme usually increases the data conversion time and the data amount by more than a multiple of n. To use shifted deflection boundaries in the data conversion in the hierarchy process data conversion scheme, the scheme should divide as appropriate an hierarchical structure such as an array present in the data. More time is thus necessary for calculation to create drawing data having the shifted deflection boundaries.

JPH10-32188 discloses a lithography system that can use one set of drawing data prepared in advance to perform the multiple patterning using the shifted deflection boundaries. This is to solve the issue of the increase in the data conversion time and the drawing data. In the lithography system, the drawing data should be divided in advance into suitable field-sizes (clusters), each size being smaller than the lowest-stage deflection width (subfield size).

The divided drawing data can be used to perform the multiple patterning using the shifted deflection boundaries without preparing a plurality of sets of drawing data having different deflection boundaries. The system may prepare one set of drawing data divided into a suitable cluster size regardless of the number of multiple patterning. The system can thus greatly reduce the calculation time required for the conversion to the drawing data and the data amount necessary for the multiple patterning.

JPH3-219617 discloses a lithography method in which the drawing data is divided into patterning fields. One side length of the divided field is an integral fraction of the maximum field length of the electron beam lithography system. Depending on the patterning purposes, the field in patterning is configured in units of divided data or in units of combination of a plurality of sets of data.

Using one set of drawing data divided into the fields, the patterning method sets the field size in patterning to a predetermined size depending on the patterning purposes. Specifically, when the patterning accuracy takes priority over the patterning time, small fields can be used in patterning with the effect of the deflection distortion minimized. When, in contrast, the patterning time takes priority over the patterning accuracy, a plurality of divided fields can be coupled to perform the patterning in a larger field size.

Unfortunately, JPH10-32188 and JPH3-219617 disclose a lithography system and method that should prepare drawing data divided into suitable sizes, each size being smaller than the lowest-stage field size. The division increases the data amount. This is because the field division divides the drawing pattern in the vicinity of the field boundaries, thus increasing the total number of drawing patterns.

In wiring patterns of the semiconductor integrated circuit, when the division size is sufficiently larger than the minimum line width of the patterns, the number of divided drawing patterns is usually inversely proportional to the division width. When, therefore, the division width is reduced to 1/n, the data amount is increased by a multiple of n. When the original figure to be divided is larger than the division width, the number of divided drawing patterns is inversely proportional to the square of the division width. When, therefore, the division width is reduced to 1/n, the data amount is increased by a multiple of n squared.

The semiconductor integrated circuits also tend to increase in scale, thereby increasing the drawing data. A combination of memory circuits and logic circuits or a patterned mask used in the exposure system requires optical proximity correction. The correction further increases the data amount.

The data increase leads to a larger data processing calculator or a larger external storage unit, thereby increasing the capital investment in semiconductor manufacturing. The data processing time and the data transfer time using data input/output and a network also increase. These reduce the productivity of the semiconductor devices, finally increasing the cost of the semiconductor integrated circuits.

JPH11-274036 discloses a method to solve the above issue by performing the highly accurate multiple patterning without the increase in data amount.

SUMMARY OF THE INVENTION

An aspect of the present invention provides a charged-particle beam lithography system in which a region to be patterned is divided into a plurality of frames, a main deflection positions a charged-particle beam to a subfield within the frame, and an auxiliary deflection draws a pattern in units of subfield, the lithography system comprising: a beam optical system including a deflector deflecting the beam; a driver driving the deflector; and a deflection control portion controlling the driver according to drawing data indicating a pattern to be drawn, the deflection control portion drawing a pattern in units of stripe including a first frame drawing region and a second frame drawing region, the first frame region corresponding to one of the divided frames, and the second frame drawing region being a region moved by a distance C from the first drawing region toward a frame to be drawn next, the deflection control portion controlling the driver to alternately pattern a first sub-field drawing region in the first frame drawing region and a second sub-field drawing region in the second frame drawing region, and the distance C satisfying a condition 0<C<Ws, where the Ws is a width of the subfield.

Another aspect of the present invention provides a charged-particle beam lithography method for use in a charged-particle beam lithography system in which a region to be patterned is divided into a plurality of frames, a main deflection positions a charged-particle beam to a subfield within the frame, and an auxiliary deflection draws a pattern in units of subfield, the lithography system comprising: a beam optical system including a deflector deflecting the beam; a driver driving the deflector; and a deflection control portion controlling the driver according to drawing data indicating a pattern to be drawn, the charged-particle beam being deflected by multi-stage deflectors to draw a pattern on a sample, the region to be patterned being divided into frames to which the main deflection is capable of deflecting the charged-particle beam, and a main deflection positioning a charged-particle beam to a subfield within the frame, and an auxiliary deflection drawing a pattern in units of subfield, the charged-particle beam lithography method comprising the steps of: forming a first frame drawing region and a second frame drawing region, the first frame drawing region including one of the divided frames, and the second frame drawing region including a region moved by a distance C from the first drawn region toward a frame to be drawn next, the distance C satisfying a condition 0<C<Ws, where the Ws is a width of the subfield; and patterning a stripe including the first frame drawing region and the second frame drawing region by alternately patterning a first sub-field drawing region in the first frame drawing region and a second sub-field drawing region in the second frame drawing region.

DETAILED DESCRIPTION OF THE EMBODIMENTS

The applicants found that the multiple exposure requires an extremely large amount of time and the drawing position of the charged-particle beam shifts largely particularly at frame boundaries. The present invention is based on this knowledge.

[Electron Beam Lithography System]

An electron beam lithography system according to an embodiment of the present invention will be described below.

Figure 1:
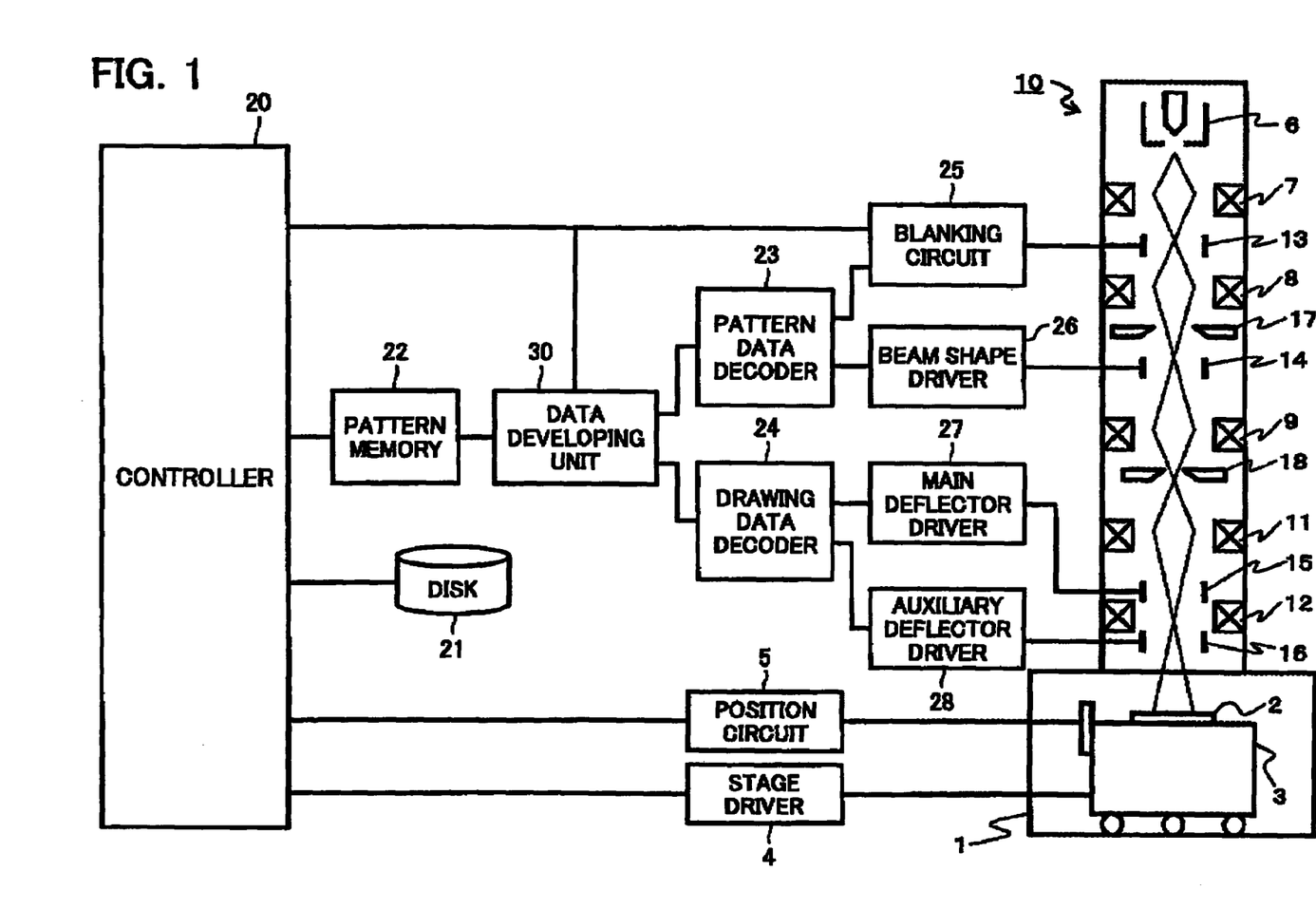
FIG. 1 is a configuration diagram of an electron beam lithography system according to an embodiment of the present invention.

FIG. 1 is a configuration diagram of an electron beam lithography system according to a first embodiment of the present invention. The electron beam lithography system includes a sample chamber 1. The chamber 1 contains a stage 3. The stage 3 bears a sample 2 such as a mask to be electron-beam patterned. The stage 3 is driven by a stage driver circuit 4 in the X-direction (the horizontal direction in the plane of FIG. 1) and the Y-direction (the depth direction in the plane of FIG. 1). The position of the stage 3 is measured by a position circuit 5 including a laser distance meter or the like.

An electron beam optical system 10 resides above the sample chamber 1. The optical system 10 includes an electron gun 6, various lenses 7, 8, 9, 11, and 12, a blanking deflector 13, a beam-dimension adjusting deflector 14, a beam-scanning main deflector 15, a beam-scanning auxiliary deflector 16, and two beam-shaping apertures 17 and 18.

Figure 2:
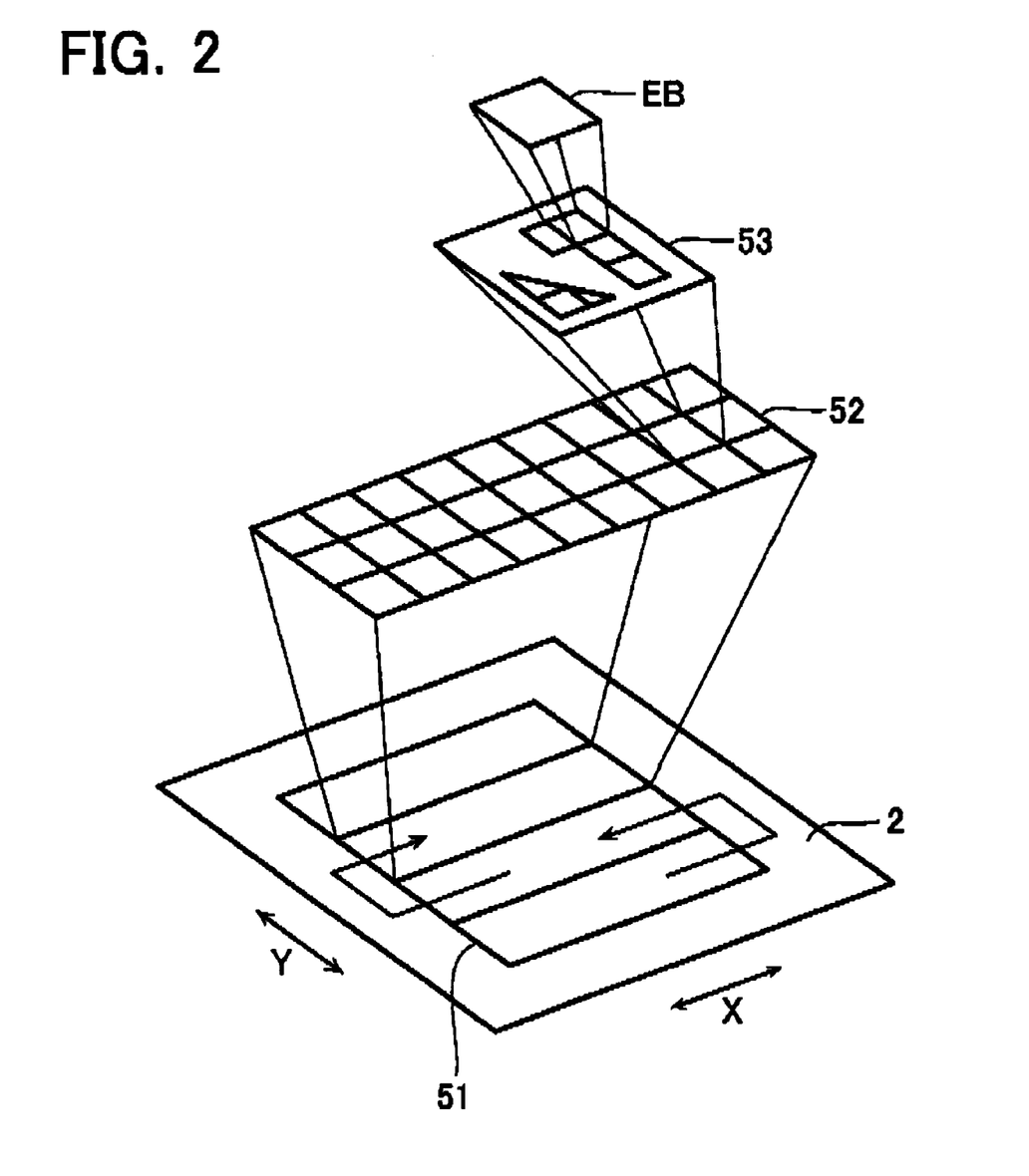
FIG. 2 is a schematic diagram illustrating an electron beam lithography method according to an embodiment of the present invention.

Referring to FIG. 2, the system typically draws a pattern on the sample 2 using the electron beam as follows. A pattern 51 to be drawn on the sample 2 is divided into strip-like frame regions 52. Each frame region 52 is patterned while the stage 3 is continuously moved in the X-direction. The frame region 52 is further divided into sub-field regions 53. Only the necessary portion within the sub-field region 53 is patterned by a deflected variable shaped beam such as the electron beam EB. The optical system 10 includes two deflectors: the main deflector 15 and the auxiliary deflector 16. The main deflector 15 positions the electron beam to the sub-field region 53. The auxiliary deflector 16 draws a pattern on the sub-field region 53 using the electron beam.

The electron beam lithography system may draw a pattern on the sample as follows. The main deflector 15 positions the electron beam to a predetermined one of the sub-field regions 53. The auxiliary deflector 16 determines a pattern-drawing position within the predetermined sub-field region 53. The beam-dimension adjusting deflector 14 and the beam-shaping apertures 17 and 18 control the beam shape. The sub-field region 53 is patterned while the stage 3 is continuously moved in one direction. After one sub-field region 53 is thus patterned, the next sub-field region 53 is patterned. The frame region 52 is a strip-like drawing region defined by the deflection width of the main deflector 15. The sub-field region 53 is a unit drawing region defined by the deflection width of the auxiliary deflector 16.

After the frame region 52 including a plurality of sub-field regions 53 is patterned, the stage 3 is moved stepwise as necessary in a direction perpendicular to the direction in which the stage 3 is continuously moved. The next frame region 52 is then patterned.

The controller 20 has a storage medium such as a magnetic disk 21 connected thereto. The magnetic disk 21 stores drawing data of a mask. After read from the magnetic disk 21, the drawing data is temporarily stored in the pattern memory 22 for each frame region 52. The pattern data for each frame region 52 stored in the pattern memory 22, such as the drawing position and drawing figure data, forms a part of frame information. The frame information is sent via a data developing unit 30 to a data analysis portion such as a pattern data decoder 23 and a drawing data decoder 24.

The data developing unit 30 has a function of selecting and extracting, from data stored in the pattern memory 22, data included in the frame region set by the controller 20. The data from the data developing unit 30 is therefore data of the stripe used in the actual drawing. The actual drawing is performed according to data of the frame region as described below.

Output from the pattern data decoder 23 is connected to a blanking circuit 25 and a beam shape driver 26. Specifically, the pattern data decoder 23 uses the above data to create blanking data. The blanking data is sent to the blanking circuit 25. The pattern data decoder 23 also creates desired beam-dimension data. The beam-dimension data is sent to the beam shape driver 26. The beam shape driver 26 sends a predetermined deflection signal to the beam-dimension adjusting deflector 14 in the electron optical system 10. The deflection signal controls a dimension of the electron beam.

The drawing data decoder 24 sends output to the main deflector driver 27 and the auxiliary deflector driver 28. The main deflector driver 27 sends a predetermined deflection signal to the main deflector 15 in the electron optical system 10. The deflection signal deflects the electron beam to a predetermined main deflection position. The auxiliary deflector driver 28 sends a predetermined auxiliary deflection signal to the auxiliary deflector 16. The auxiliary deflection signal causes the electron beam to draw a pattern in the sub-field region 53.

[Electron Beam Lithography Method]

A drawing method of an electron beam lithography system according to an embodiment of the present invention is described below.

Figure 3:
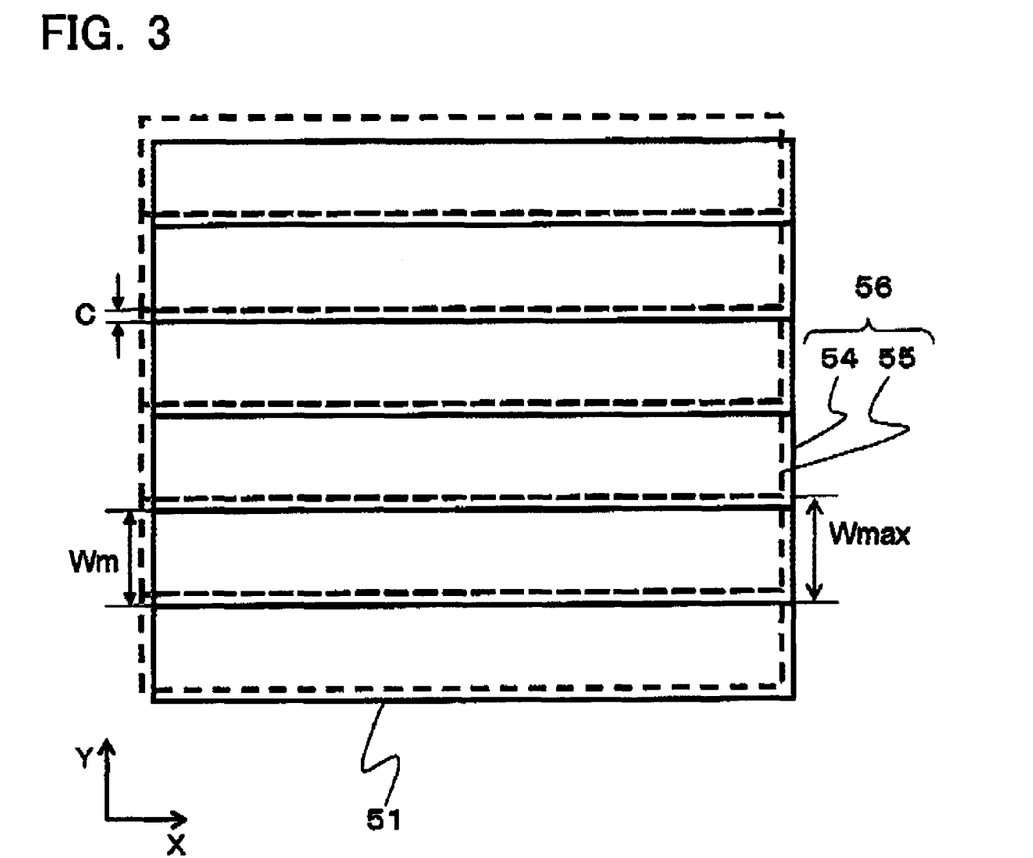
FIG. 3 is a configuration diagram of a stripe according to an embodiment of the present invention.

Referring to FIG. 3, in this embodiment, a stripe 56 is created in the data developing unit 30 of the electron beam lithography system.

Specifically, the pattern 51 to be drawn is divided into stripe-like frame regions. Each of the divided frame regions is defined as a first frame drawing region 54. A second frame drawing region 55 is defined as a region disposed across one of the first frame drawing regions 54 and another first frame drawing region 54 to be drawn next. The first frame drawing region 54 and the second frame drawing region 55 together form a stripe 56 having a width Wm. The patterning is done for each stripe 56.

Referring to FIG. 3, in this embodiment, the second frame drawing region 55 corresponds to the first frame drawing region 54 that is moved a distance C in the width direction. The distance C satisfies the condition $0<C<Ws$, where Ws is the width of a subfield. The frame width is usually almost equal to the maximum deflection width Wmax of the main deflector 15. In this embodiment, however, the Wm satisfies $C+Wm<Wmax$.

Figure 4:
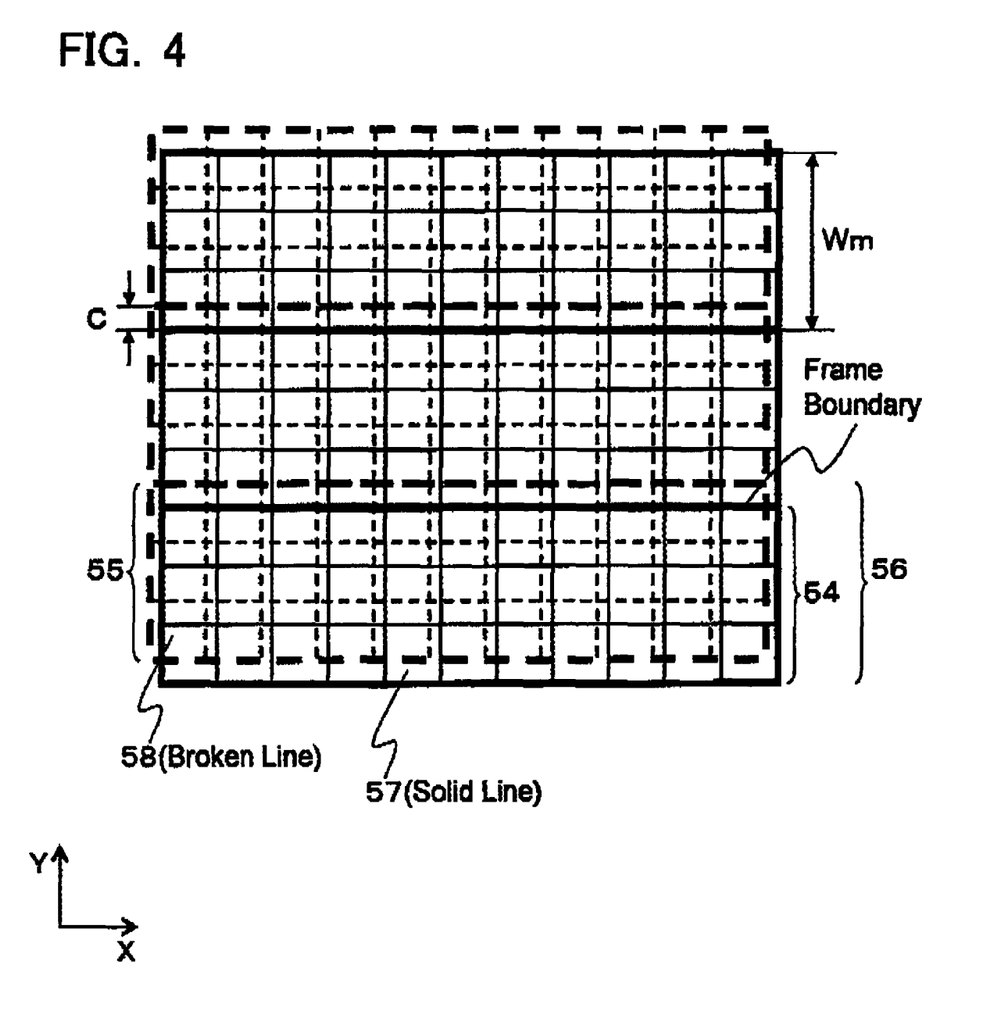
FIG. 4 is a detailed configuration diagram of a stripe according to an embodiment of the present invention.

Referring to FIG. 4, the configuration of the stripe 56 is described below. The stripe 56 includes two frame regions: the first frame drawing region 54 (shown as a solid line) and the second frame drawing region 55 (shown as a broken line). The second frame drawing region 55 is shifted by a distance C from the first frame drawing region 54 in the width direction.

The first frame drawing region 54 includes first sub-field drawing regions 57, which are shown as solid lines. The second frame drawing region 55 includes second sub-field drawing regions 58, which are shown as broken lines. The first frame drawing region 54 is shifted by the distance C from the second frame drawing region 55. The distance C is preferably half the width Ws of the subfield ($C=(1/2) \times Ws$), as described below.

A patterning procedure of the electron beam lithography system in this embodiment is described below.

First, the sample 2 is disposed on the stage 3 in the sample chamber 1. The position of the stage 3 is then detected by the position circuit 5. Then, according to the signal from the controller 20, the stage driver 4 moves the stage 3 to a position that allows the sample 2 to be patterned.

The electron gun 6 then emits the electron beam. The electron beam is focused by a condenser lens 7. The blanking deflector 13 may transmit or not transmit the electron beam to the sample 2.

The electron beam is then incident on the aperture 17. The beam passes through the opening of the aperture 17. The beam is then deflected by the beam-dimension adjusting deflector 14, which is controlled by the beam shape driver 26. The beam then passes through the opening of the beam-shaping aperture 18. The electron beam is thus finally shaped to a desired beam shape such as a spot pattern. The spot pattern is a drawing unit of the electron beam irradiated to the sample 2. A plurality of spot patterns form one drawing pattern.

After the electron beam is shaped to the spot pattern, it is reduced by the reduction lens 11. A pattern is drawn on the sample 2 by irradiating the electron beam to the sample 2. The irradiation position on the sample 2 is controlled by the main deflector 15 and the auxiliary deflector 16. The main deflector driver 27 controls the main deflector 15. The auxiliary deflector driver 28 controls the auxiliary deflector 16. The main deflector 15 deflects the electron beam to a predetermined region on the sample 2 where the beam is then deflected by the auxiliary deflector. In other words, the main driver 15 positions the first and second frame drawing regions 54 and 55 included in the stripe 56. The auxiliary deflector 16 positions the figure drawing position in the first and second sub-field drawing regions 57 and 58.

A pattern is drawn on the sample 2 by the electron beam as follows. The sample 2 is scanned by the electron beam while the stage 3 is moved in one direction so that a pattern is drawn in the first and second sub-field drawing regions 57 and 58.

The electron beam lithography method in this embodiment patterns a region of the first sub-field drawing regions 57 and then a region of the second sub-field drawing regions 58. The two regions 57 and 58 are overlapped. Then another region of the first sub-field drawing regions 57 is patterned. The other region is adjacent to the patterned region of the first sub-field drawing regions 57. Then another region of the second sub-field drawing regions 58 is patterned. The other region is adjacent to the patterned region of the second sub-field drawing regions 58.

In this way, one of the first sub-field drawing regions 57 and one of the second sub-field drawing regions 58 are alternately patterned. Patterns are thus drawn in the first and second frame drawing regions 54 and 55. Therefore, multiple patterning of the formed stripe 56 may be performed.

After patterning the formed stripe 56, the next stripe 56 is formed and is similarly patterned by the electron beam.

A description is given of how the controller 20 controls the patterning. The controller 20 reads the drawing data of the mask recorded in storage media such as the magnetic disk 21. The controller 20 then temporarily stores the drawing data in the pattern memory 22 for each frame region 52.

The drawing data for each frame region 52 stored in the pattern memory 22, such as the drawing position and drawing figure data, forms a part of the frame information. The drawing data of the stripe 56 to be patterned is formed by the data developing unit 30. The drawing data is then sent via the pattern data decoder 23 and the drawing data decoder 24 as a data analysis portion, to the blanking circuit 25, the beam shape driver 26, the main deflector driver 27, and the auxiliary deflector driver 28.

The pattern data decoder 23 creates the blanking data according to the drawing data from the data developing unit 30. The decoder 23 then sends the blanking data to the blanking circuit 25. The decoder 23 also creates, according to the drawing data, the desired beam-shape data. The decoder 23 then sends the beam-shape data to the beam shape driver 26.

The beam shape driver 26 applies a predetermined deflection signal to the beam-dimension adjusting deflector 14 in the optical system 10. The deflection signal controls the dimension of the electron beam.

The drawing data decoder 24 creates, according to the drawing data, subfield determination data. The decoder 24 then sends the subfield determination data to the main deflector driver 27. The main deflector driver 27 then applies a predetermined deflection signal to the main deflector 15. The deflection signal deflects the electron beam to a predetermined subfield position.

The drawing data decoder 24 generates, according to the drawing data, a control signal for scanning of the auxiliary deflector 16. The decoder 24 then sends the control signal to the auxiliary deflector driver 28. The auxiliary deflector driver 28 applies a predetermined auxiliary deflection signal to the auxiliary deflector 16. A pattern is thus drawn in the sub-field region 53.

The electron beam lithography method in this embodiment will be described in more detail.

Note that the first and second frame drawing regions 54 and 55 are overlapped by the distance C. The distance C equals half the width Ws of the subfield (C=(½)×Ws). In other words, the centers of the first sub-field drawing regions 57 in the first frame drawing region 54 reside on the respective boundaries of the second sub-field drawing regions 58 in the second frame drawing region 55.

Figure 5:
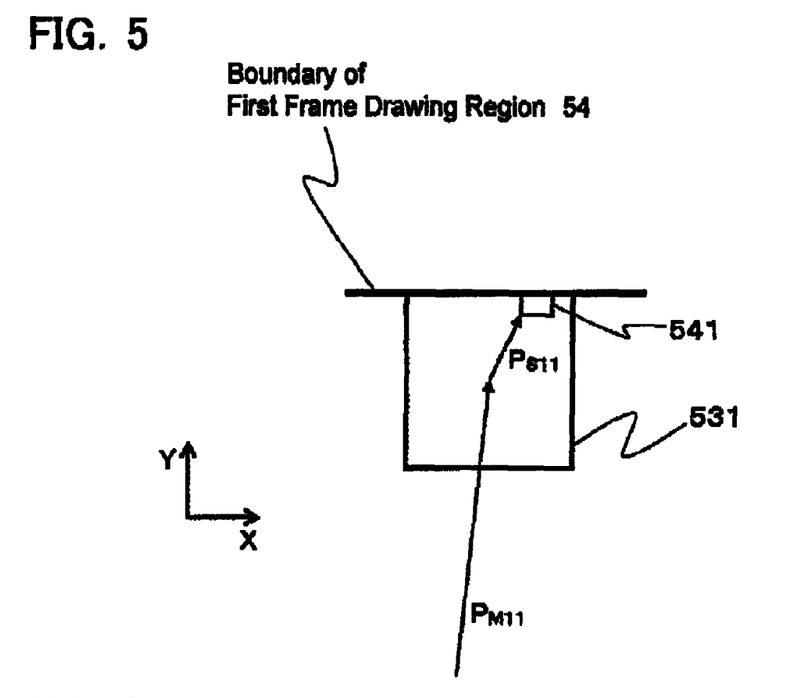
FIG. 5 is a process sheet (1) of patterning of an electron beam lithography method according to an embodiment of the present invention.

With reference to FIG. 5, at first, according to the formed stripe 56, the electron beam is irradiated to a region 541 to be patterned in the first sub-field drawing region 531 in the first frame drawing region 54 in order to pattern the region 541. Specifically, the main deflector 15 first deflects the electron beam (PM11 in FIG. 5). The auxiliary deflector 16 then deflects the electron beam (PS11) to irradiate the beam to the region 541. In this way, in the first sub-field drawing region 531, the electron beam draws a pattern in the region 541 to be patterned. The region 541 is in contact with a frame boundary, which is a boundary of the first frame drawing region 54.

Figure 6:
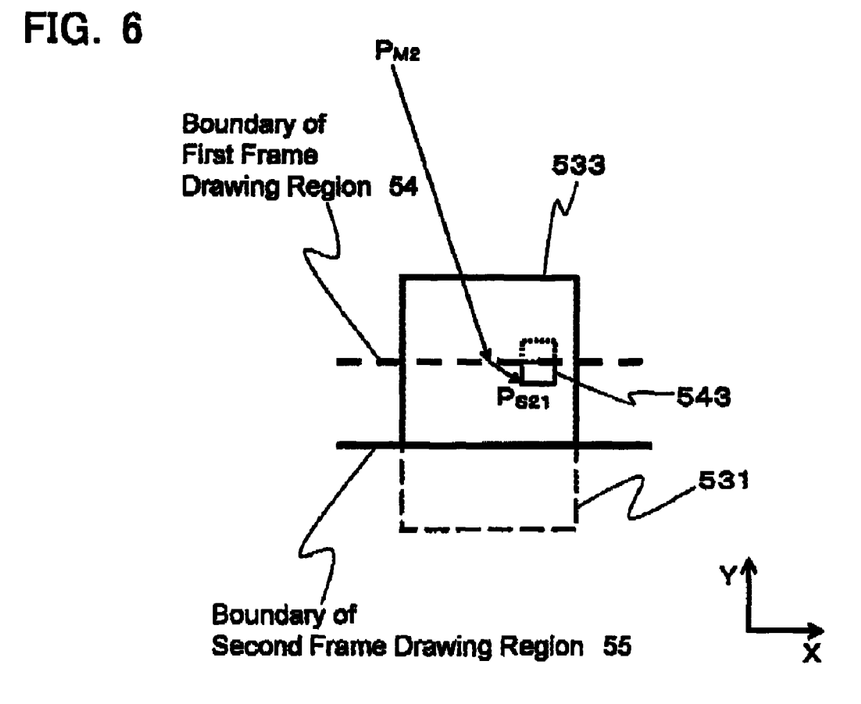
FIG. 6 is a process sheet (2) of patterning of an electron beam lithography method according to an embodiment of the present invention.

With reference to FIG. 6, the main deflector 15 then deflects the electron beam to a region 543 to be patterned in the second sub-field drawing region 533 in the second frame drawing region 55 in order to irradiate the beam to the region 543 and pattern the region 543. Specifically, the main deflector 15 first deflects the electron beam (PM2 in FIG. 6). The auxiliary deflector 16 then deflects the electron beam (PS21) to irradiate the beam to the region 543. In this way, in the second sub-field drawing region 533, the electron beam draws a pattern in the region 543 to be patterned. Note that in the ideal case where a patterning-position shift due to the electron beam deflection or the like does not occur, the region 543 to be patterned coincides with the region 541 to be patterned. The region 541 has been irradiated with the electron beam in the first sub-field drawing region 531.

Figure 7:
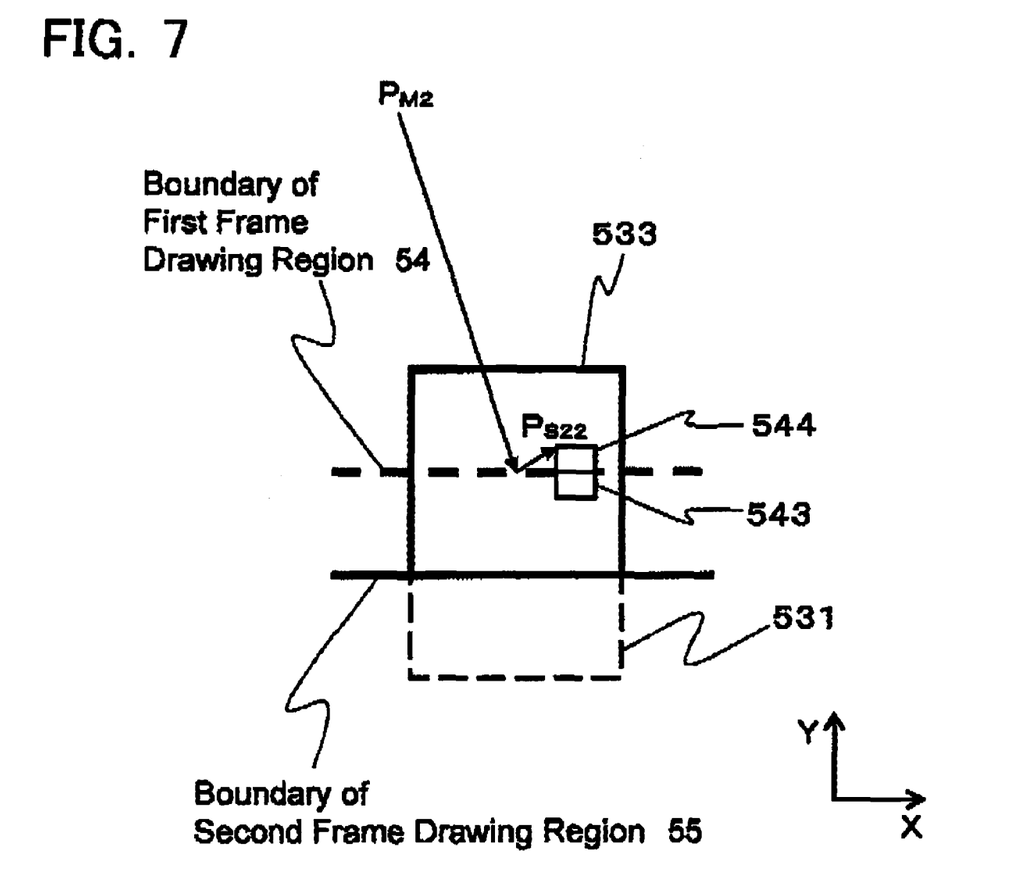
FIG. 7 is a process sheet (3) of patterning of an electron beam lithography method according to an embodiment of the present invention.

With reference to FIG. 7, the electron beam is then irradiated to a region 544 to be patterned in the second sub-field drawing region 533 in order to pattern the region 544. The region 544 is outside of the boundary of the first sub-field drawing region 531. Specifically, the main deflection is kept the same and the auxiliary deflector 16 deflects the electron beam (PS22) to irradiate the beam to the region 544. In this way, in the second sub-field drawing region 533, the electron beam draws a pattern in the region 544 to be patterned.

If the patterning is ideal, the region 541 to be patterned and the region 543 to be patterned should coincide with each other. The electron beam deflection has, however, an aberration and errors, which shift the patterning-position.

Figure 8:
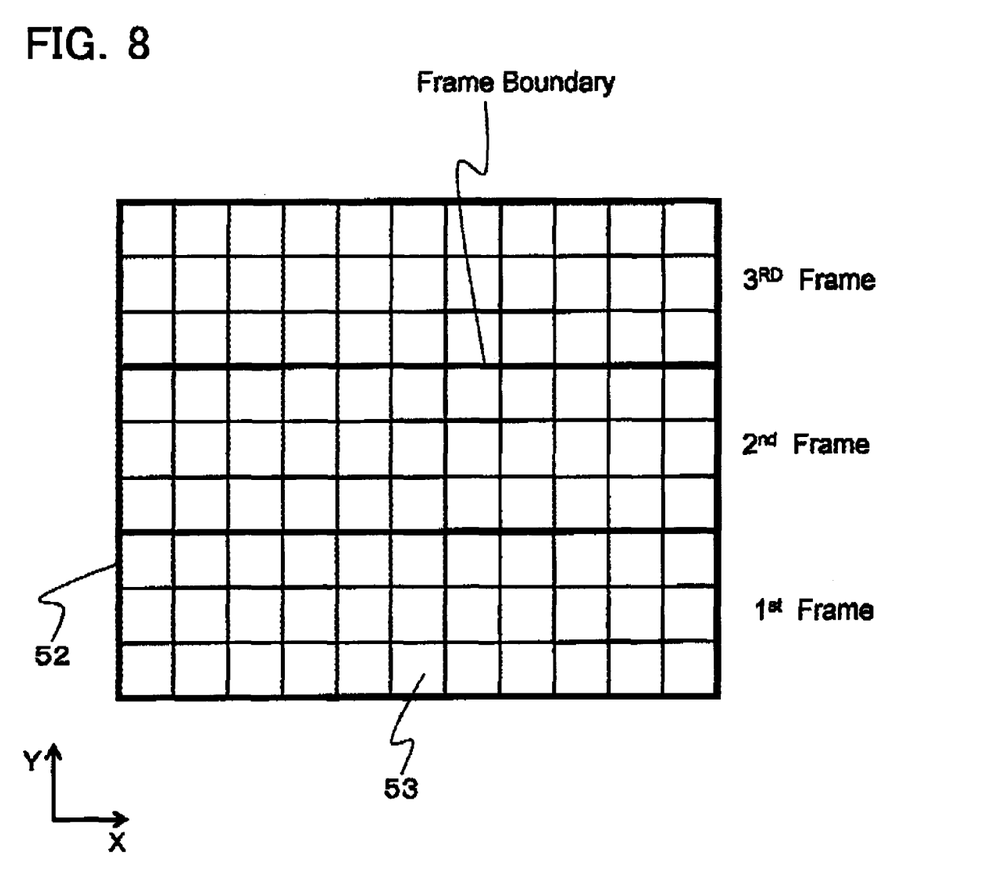
FIG. 8 shows a general relationship between a frame region and a sub-field region.
Figure 9A:
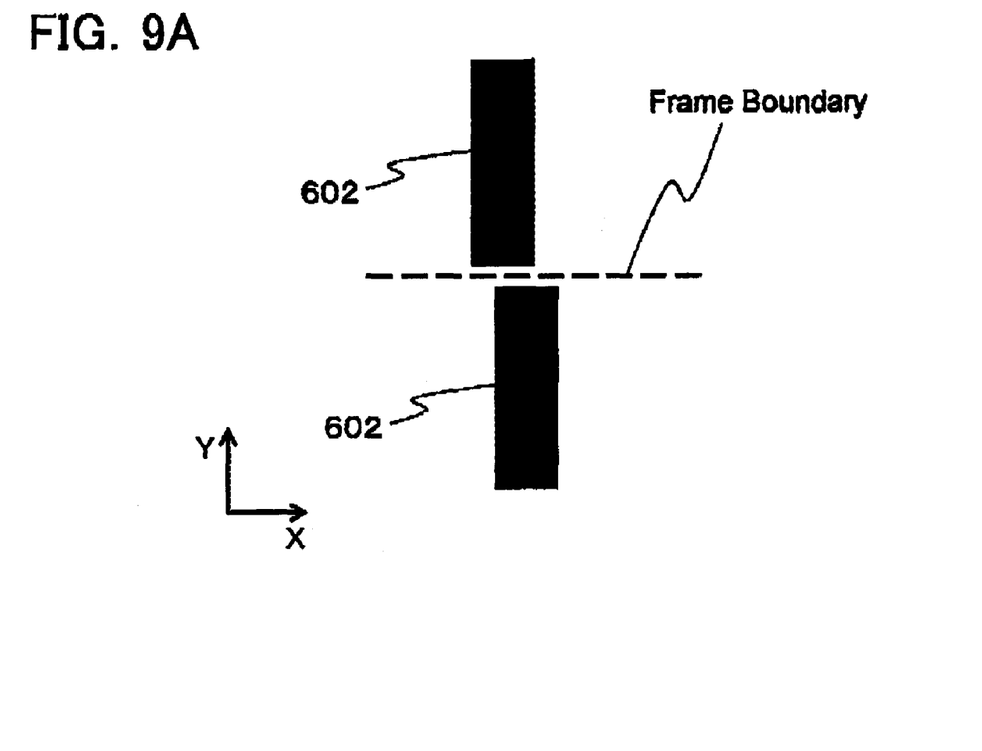
FIGS. 9A and 9B illustrate drawn patterns.

Specifically, when patterns are drawn without the multiple exposure as shown in FIG. 8, and the exposure is performed ideally, the electron beam will be irradiated to ideal drawing positions even in a sub-field region in contact with a frame boundary to draw patterns. When, however, the electron beam deflection shifts the electron beam irradiation positions during drawing, there is a possibility that an area without patterning may be formed at the frame boundary. Specifically, in reference to FIG. 9A, when the electron beam draws an electrode pattern across a plurality of frame regions, broken electrode patterns 602 may occur. This leads to faulty semiconductor integrated circuits. The electron beam irradiation-position shift is usually a combination of an X-direction position shift due to the electron beam deflection and a Y-direction position shift due to the electron beam deflection.

Figure 9B:
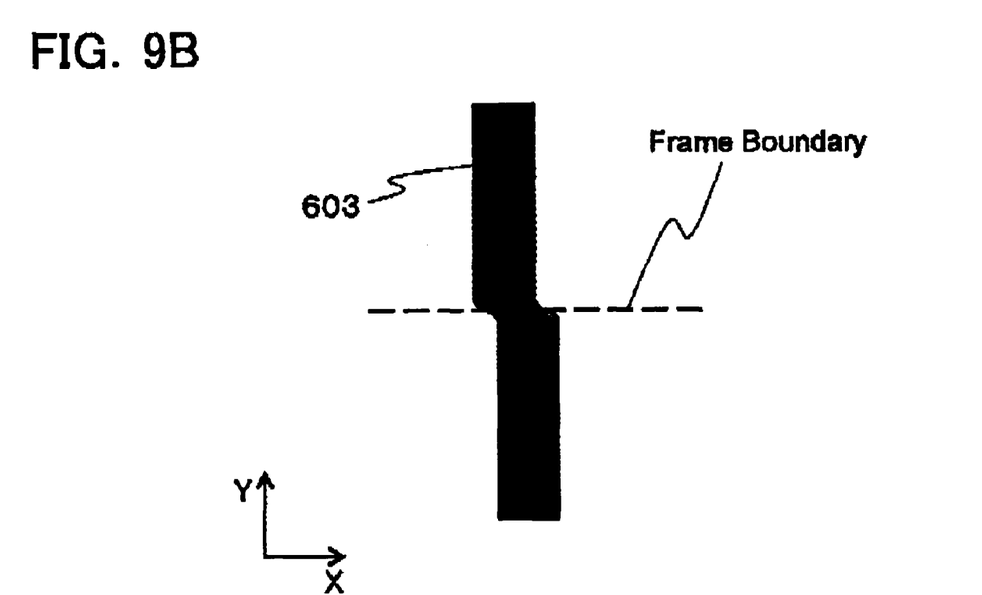

According to an embodiment of the present invention, the drawing position errors of the electron beam may be reduced. In particular, the drawing position errors in the y-axis direction at the frame boundaries may be reduced. Specifically, when a pattern to be drawn exists on the boundary of the frame drawing region 54 that includes the first sub-field drawing region 531, the pattern exists not on the boundary of the second sub-field drawing region 533 but inside thereof. Similarly, when a pattern to be drawn exists on the boundary of the frame drawing region 55 that includes the second sub-field drawing region 533, the pattern exists not on the boundary of the first sub-field drawing region 531 but inside thereof. Accordingly, as described above, by employing a multiple patterning for the two overlapping frame drawing regions 54 and 55, every pattern is positioned at a center of a sub-field drawing region in either one of the drawing areas 54 or 55, and is not positioned at boundaries of the both at the same time. As a result, an amount of error is averaged. Therefore, as shown in FIG. 9B, the electron beam may draw an electrode pattern 603 that is not broken.

Thus, even if there exists a certain positional error in the X-axis direction of the electron beam due to the deflection, a positional error in the Y-axis direction becomes extremely small. Therefore, as shown in FIG. 9B, the electron beam may draw an electrode pattern 603 that is not broken.

For the multiple patterning, the stage is moved for every drawing of the formed stripe. The multiple patterning may thus be improved in throughput.

Thus, a system and a method for the electron beam lithography system according to preferred embodiments of the present invention have been described in detail, but the present invention is not limited to the disclosed embodiments, and other embodiments may also be possible.

What is claimed is:

1. A charged-particle beam lithography system in which a region to be patterned is divided into a plurality of frames, a main deflection positions a charged-particle beam to a subfield within the frame, and an auxiliary deflection draws a pattern in units of subfield, the lithography system comprising:
   a beam optical system including a deflector that deflects the beam;
   a driver that drives the deflector; and
   a deflection control portion that controls the driver according to drawing data indicating a pattern to be drawn,
   the deflection control portion configured to draw a pattern in units of a stripe including a first frame drawing region and a second frame drawing region, the first frame drawing region corresponding to one of the divided frames, and the second frame drawing region being a region moved by a distance C from the first drawing region toward a frame to be drawn next,
   the deflection control portion configured to control the driver to alternately pattern a first sub-field drawing region in the first frame drawing region and a second sub-field drawing region in the second frame drawing region, and
   the distance C satisfying a condition 0<C<Ws, where the Ws is a width of the subfield.

2. The charged-particle beam lithography system according to claim 1, further comprising:
   a pattern memory storing pattern data for each frame; and
   a data developing unit that generates data of the stripe from the pattern data.

3. The charged-particle beam lithography system according to claim 1, further comprising:
   a stage that bears a sample, the stage being configured to be continuously movable in a first direction, the stage also configured to be stepwise movable in a second direction perpendicular to the first direction,
   wherein
   the deflector comprises a main deflector that positions the beam to one of the subfields as the stage moves in the first direction and an auxiliary deflector that positions the beam in the subfield.

4. The charged-particle beam lithography system according to claim 3, wherein
   the deflection control portion is further configured to control the driver such that the frame is a strip-like region defined by a deflection width of the main deflector and the subfield is a region defined by a deflection width of the auxiliary deflector.

5. The charged-particle beam lithography system according to claim 1, wherein
   the deflection control portion is further configured to control the driver such that the second sub-field drawing region has a center on a boundary of the first frame drawing region.

6. The charged-particle beam lithography system according to claim 1, wherein
   the deflection control portion is further configured to control the driver such that the stripe has a width Wm, and a maximum deflection width Wmax of the main deflection of the charged-particle beam lithography system is larger than C+Wm.

7. The charged-particle beam lithography system according to claim 6, wherein
   the deflection control portion is further configured to control the driver such that the second sub-field drawing region has a center on a boundary of the first frame drawing region.

8. A charged-particle beam lithography method for use in a charged-particle beam lithography system in which a region to be patterned is divided into a plurality of frames, a main deflection positions a charged-particle beam to a subfield within the frame, and an auxiliary deflection draws a pattern in units of subfield, the lithography system comprising:
   a beam optical system including a deflector that deflects the beam;
   a driver that drives the deflector; and
   a deflection control portion that controls the driver according to drawing data indicating a pattern to be drawn,
   the charged-particle beam lithography method comprising:
   forming a first frame drawing region and a second frame drawing region, the first frame drawing region including one of the divided frames, and the second frame drawing region including a region moved by a distance C from the first drawn region toward a frame to be drawn next, the distance C satisfying a condition 0<C<Ws, where the Ws is a width of the subfield; and
   patterning a stripe including the first frame drawing region and the second frame drawing region by alternately patterning a first sub-field drawing region in the first frame drawing region and a second sub-field drawing region in the second frame drawing region.

9. The charged-particle beam lithography method according to claim 8, wherein
   the second sub-field drawing region has a center on a boundary of the first frame drawing region.

10. The charged-particle beam lithography method according to claim 8, wherein
    the stripe has a width Wm, and
    a maximum deflection width Wmax of the main deflection of the charged-particle beam lithography system is larger than C+Wm.

11. The charged-particle beam lithography method according to claim 10, wherein
    the second sub-field drawing region has a center on a boundary of the first frame drawing region.

* * * * *